United States Patent
Pyeon

(10) Patent No.: US 8,068,382 B2
(45) Date of Patent: Nov. 29, 2011

(54) SEMICONDUCTOR MEMORY WITH MULTIPLE WORDLINE SELECTION

(75) Inventor: Hong-Beom Pyeon, Kanata (CA)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 101 days.

(21) Appl. No.: 12/564,492

(22) Filed: Sep. 22, 2009

(65) Prior Publication Data

US 2011/0032784 A1 Feb. 10, 2011

Related U.S. Application Data

(60) Provisional application No. 61/213,990, filed on Aug. 5, 2009.

(51) Int. Cl.
*G11C 8/00* (2006.01)

(52) U.S. Cl. .............. 365/230.06; 365/230.01; 365/191; 365/207; 365/230.08

(58) Field of Classification Search ............ 365/230.06, 365/230.01, 191, 207, 230.08
See application file for complete search history.

(56) References Cited

U.S. PATENT DOCUMENTS

| | | | |
|---|---|---|---|
| 4,802,129 A | 1/1989 | Hoekstra et al. | |
| 5,802,555 A | 9/1998 | Shigeeda | |
| 5,953,538 A | 9/1999 | Duncan et al. | |
| 6,944,093 B2 | 9/2005 | Sumitani | |
| 7,505,295 B1 * | 3/2009 | Nataraj et al. | 365/49.1 |
| 7,533,222 B2 | 5/2009 | Leung | |
| 7,599,975 B1 | 10/2009 | Donovan et al. | |
| 7,742,334 B2 | 6/2010 | Fujisawa et al. | |
| 2010/0157715 A1 | 6/2010 | Pyeon | |
| 2010/0161877 A1 | 6/2010 | Pyeon | |

OTHER PUBLICATIONS

Written Opinion of the International Searching Authority mailed on Apr. 19, 2010 in connection with International Patent Application PCT/CA2009/001860, 4 pages.

International Search Report mailed on Apr. 19, 2010 in connection with International Patent Application PCT/CA2009/001860, 5 pages.

Notice of Allowance and Fee(s) Due issued by the United States Patent and Trademark Office on Jun. 10, 2011 in connection with U.S. Appl. No. 12/337,841, 9 pages.

* cited by examiner

*Primary Examiner* — Thong Q Le

(57) ABSTRACT

A semiconductor memory circuit, comprising: a memory array, the memory array including a plurality of wordlines each connected to a respective row of cells and a plurality of bitlines each connected to a respective column of cells. The semiconductor memory circuit also comprises at least one row decoder for selecting a group of wordlines within the plurality of wordlines; and a plurality of driver circuits for driving the plurality of bitlines respectively and setting the cells connected to the group of wordlines to a predetermined logic state. Also, a method for presetting at least part of a memory array, the memory array comprising a plurality of wordlines each connected to a respective row of cells. The method comprises selecting a group of wordlines within the plurality of wordlines; and simultaneously setting memory cells connected to the group of wordlines to a predetermined logic state.

25 Claims, 6 Drawing Sheets

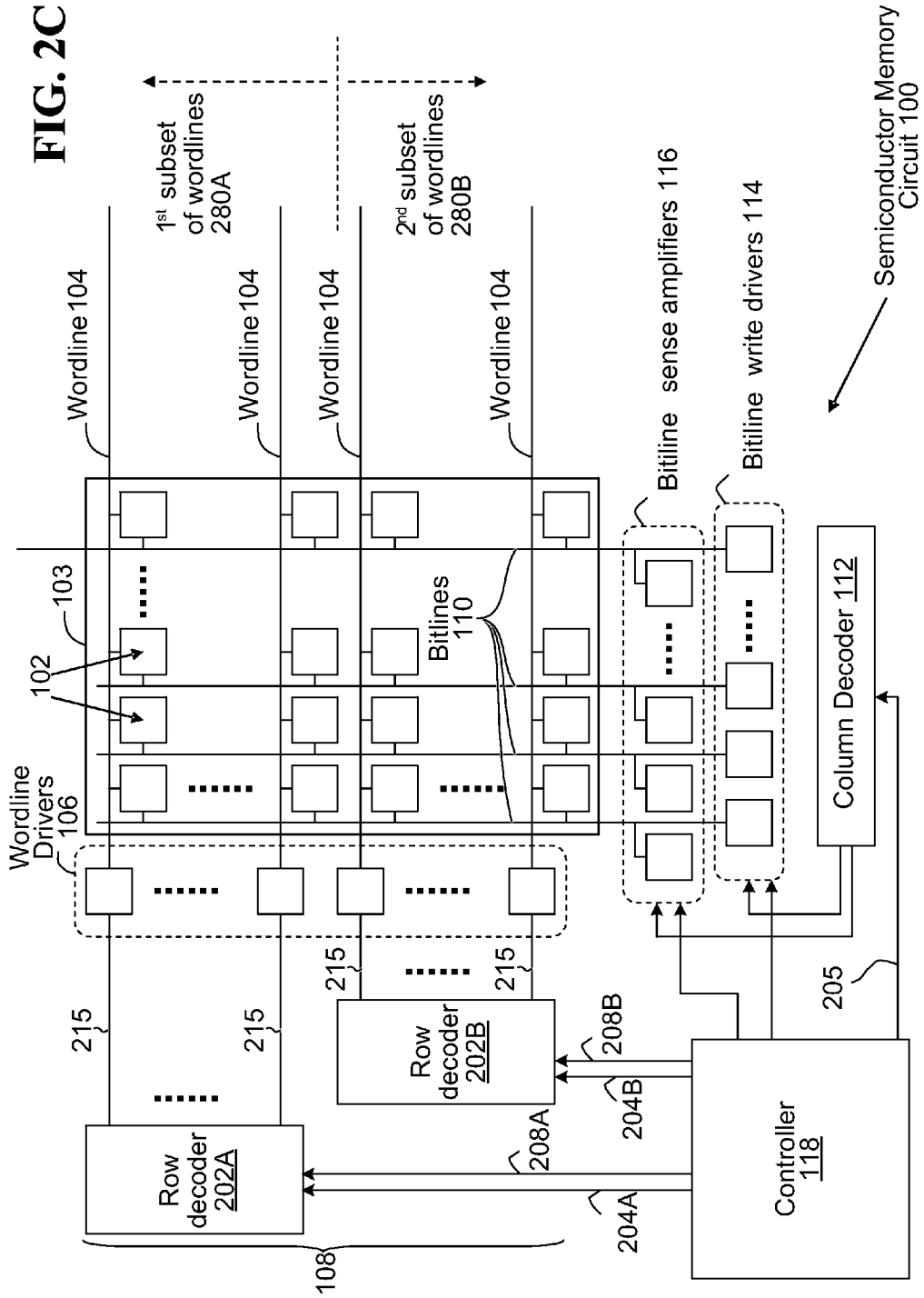

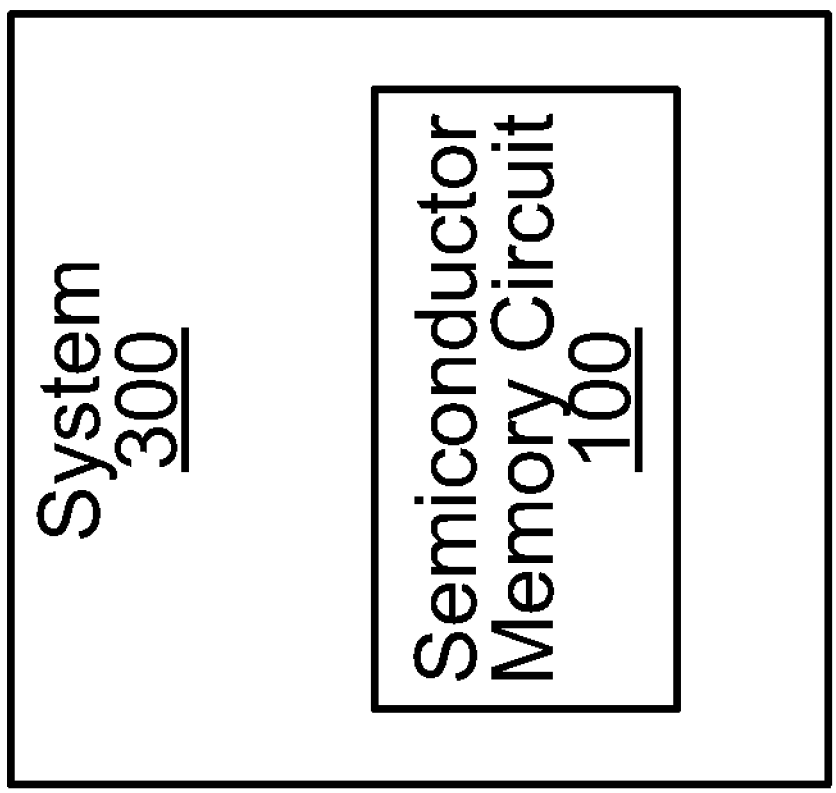

SEMICONDUCTOR MEMORY WITH MULTIPLE WORDLINE SELECTION

CROSS-REFERENCE TO RELATED APPLICATION

The present application claims the benefit under 35 USC §119(e) of U.S. Provisional Patent Application Ser. No. 61/213,990 to Hong-Beom Pyeon, filed Aug. 5, 2009, hereby incorporated by reference herein.

BACKGROUND

Semiconductor memory is used in a variety of applications. One of the most useful and widely employed types of semiconductor memory is SRAM, or static random access memory. As long as power can be continuously supplied to the cells of an SRAM array, this type of semiconductor memory allows fast access for both reading and writing individual memory cells.

In some applications, SRAM cells in a secondary array are used as a status indicator (e.g., cell validity) for corresponding memory cells in a primary array. For example, a given SRAM cell can be set to "1" when the corresponding memory cell in the primary array is deemed "valid"; prior to this event, the given SRAM cell will be expected to carry the value "0", thereby indicating that the corresponding primary cell is invalid. The use of a secondary SRAM array thus allows an external entity to rapidly access information about the validity of the cells in the primary array without having to access the primary array. This can be useful when the primary array is manufactured using a type of memory that may not allow individual cells to be as flexibly or as quickly accessed as in SRAM.

However, because SRAM cells acquire an unpredictable value upon power-up, an initialization ("preset") phase is required in order to guarantee that the given SRAM cell will indeed carry the value "0" before being written to with a "1", or vice versa. Applying this initialization operation to all SRAM cells in an array can lead to a cumbersome and lengthy preset phase.

It will be appreciated that a preset phase is required in many applications involving the use of SRAM. Improvements in the area of presetting the cells of a semiconductor memory array are therefore welcome.

SUMMARY

A first broad aspect of the present invention seeks to provide a semiconductor memory circuit, comprising: a memory array, the memory array including a plurality of wordlines each connected to a respective row of cells and a plurality of bitlines each connected to a respective column of cells. The semiconductor memory circuit also comprises at least one row decoder for selecting a group of wordlines within the plurality of wordlines; and a plurality of driver circuits for driving the plurality of bitlines respectively and setting the cells connected to the group of wordlines to a predetermined logic state.

A second broad aspect of the present invention seeks to provide a method for presetting at least part of a memory array, the memory array comprising a plurality of wordlines each connected to a respective row of cells. The method comprises selecting a group of wordlines within the plurality of wordlines; and simultaneously setting memory cells connected to the group of wordlines to a predetermined logic state.

A third broad aspect of the present invention seeks to provide a circuit for use with a memory array that comprises a plurality of wordlines each connected to a respective row of cells within a plurality of rows of cells. The circuit comprises a first input for receiving a row signal indicative of selection of a single one of the rows, hereinafter an individually selected row; a second input for receiving a preset control signal indicative of selection of a group of rows, hereinafter jointly selected rows; circuitry for combining the row signal and the preset control signal to produce, for each of the rows, a respective wordline selection signal, the wordline selection signal for each of the rows being indicative of selection of that row when it is at least one of (i) the individually selected row and (ii) one of the jointly selected rows, and being indicative of non-selection of that row when it is both not the individually selected row and not one of the jointly selected rows; and an output for releasing the wordline selection signal for each of the rows to the memory array via a wordline driver.

These and other aspects and features of the present invention will now become apparent to those of ordinary skill in the art upon review of the following description of specific embodiments of the invention in conjunction with the accompanying drawings.

BRIEF DESCRIPTION OF THE DRAWINGS

In the accompanying drawings:

FIGS. 2A-2D are block diagrams of the semiconductor memory circuit of FIG. 1, showing more detail of the at least one row decoder, in accordance with various specific non-limiting embodiments of the present invention; and FIG. 3 is a block diagram of the semiconductor memory circuit of FIG. 1 embedded in a system.

It is to be expressly understood that the description and drawings are only for the purpose of illustration of certain embodiments of the invention and are an aid for understanding. They are not intended to be a definition of the limits of the invention.

DETAILED DESCRIPTION

Figure 1:
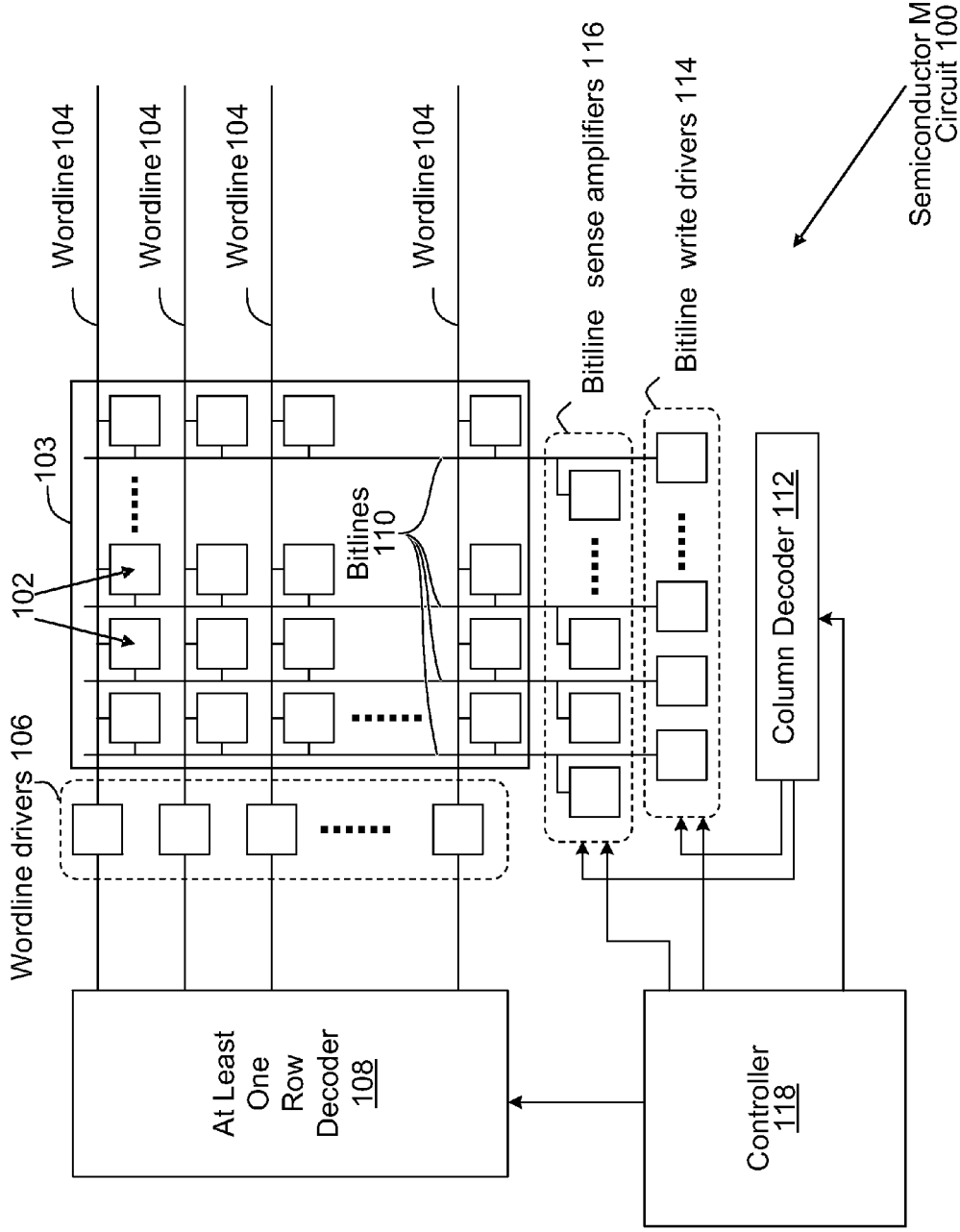
FIG. 1 is a block diagram of a semiconductor memory circuit in accordance with a non-limiting embodiment of the present invention, the semiconductor memory circuit including at least one row decoder.

Reference is made to FIG. 1, which shows a semiconductor memory circuit 100 in accordance with a specific non-limiting embodiment of the present invention, comprising memory cells 102 arranged into a memory array 103 (of rows and columns), a plurality of wordlines 104 each connected to a respective one of the rows, a plurality of wordline drivers 106 each for driving a respective one of the wordlines 104, at least one row decoder 108 (to be described later), a plurality of bitlines 110 each connected to a respective one of the columns, a column decoder 112 for selecting one or more of the bitlines 110 based on a column address, a plurality of bitline write drivers 114 each for driving a respective one of the bitlines 110 (in the case of a write), a plurality of bitline sense amplifiers 116 each for amplifying and detecting a voltage level on a respective one of the bitlines 110 (in the case of a read), and a controller 118 for controlling the at least one row decoder 108, the column decoder 112, the bitline write drivers 114 and the bitline sense amplifiers 116.

Figure 2A:
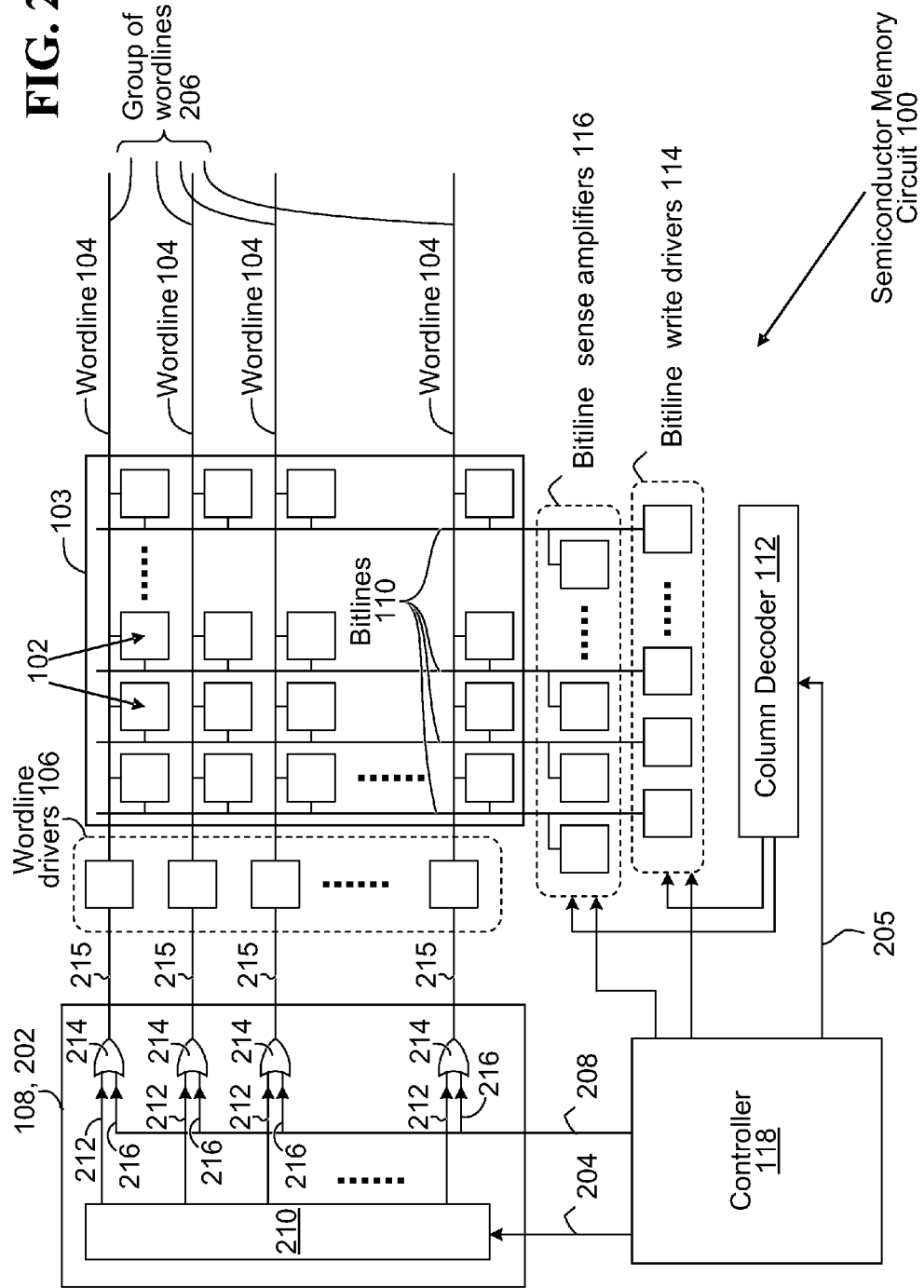

Reference is now made to FIG. 2A, which shows an example of the at least one row decoder 108, in accordance with a first specific non-limiting embodiment of the present invention. In this embodiment, the at least one row decoder 108 comprises a single row decoder 202.

The row decoder 202 is capable of selecting an individual one of the wordlines 104, based on a row signal 204 issued by the controller 118 (or by an intervening pre-decoder, not shown, which separates an address signal into its components, namely the row signal 204 and a column signal 205). Selection of a wordline can be carried out by activating the particular one of the wordline drivers 106 connected to the selected wordline. To this end, the at least one row decoder is connected to each of the wordline drivers 106 by a respective wordline selection signal 215, which can be asserted or not asserted in order to indicate whether the corresponding wordline driver is activated or not activated. An activated wordline driver corresponding to a selected wordline drives the row of cells connected to the selected wordline.

Additionally, the row decoder 202 is capable of selecting a group of wordlines 206 by activating those of the wordline drivers 106 that are connected to the wordlines in the group. The activated wordline drivers then drive the rows of cells connected to the group of wordlines 206. In the present specification, reference to a "group" of wordlines is meant indicate two or more wordlines. It should also be appreciated that the wordlines in a "group" of wordlines need not, although are permitted to, be associated with contiguous rows of cells in the memory array 103.

Selection of the group of wordlines 206 by the row decoder 202 is controlled by a preset control signal 208, which can be issued by the controller 118. The preset control signal 208 effectively overrides the aforementioned row signal 204. A possible way to implement this functionality, as shown in FIG. 2A, is to feed each of the outputs of a row decoding circuit 210 (among which a single output is asserted to indicate selection of the corresponding one of the wordlines 104) to a respective first input 212 of a respective logic "OR" gate 214, with a respective second input 216 being fed by the preset control signal 208. This will cause multiple wordlines to be selected (i.e., those in the group of wordlines 206) when the preset control signal 208 is asserted. Alternatively, the preset control signal 208 may be considered as an additional element of the row signal 204 which, if present, causes selection of the group of wordlines 206 as opposed to a single one of the wordlines 104. Still other ways of implementing the desired functionality will occur to those of skill in the art.

In operation, and with continued reference to FIG. 2A, in response to assertion of the preset control signal 208, the row decoder 202 selects the group of wordlines 206. Once the group of wordlines 206 is selected by the row decoder 202, the cells in the rows connected to the group of wordlines 206 can be written to by driving the corresponding ones of the bitlines 110. Specifically, the bitline write drivers 114 are controlled so as to set the corresponding bitlines to the appropriate levels needed to set the memory cells to the desired logic state, which can be logic "0" or logic "1", for example. Since multiple rows are selected, control of a given one of the bitlines 110 causes simultaneous writing of a cell in each of the selected rows, which can have the effect of reducing overall time required to preset the memory array 103. Of course, it should be understood that the bitlines 110 themselves need not all be driven together simultaneously. In various embodiments, the bitlines 110 can be driven one at a time, in pairs, etc., while a particular group of wordlines remains selected.

Figure 2B:
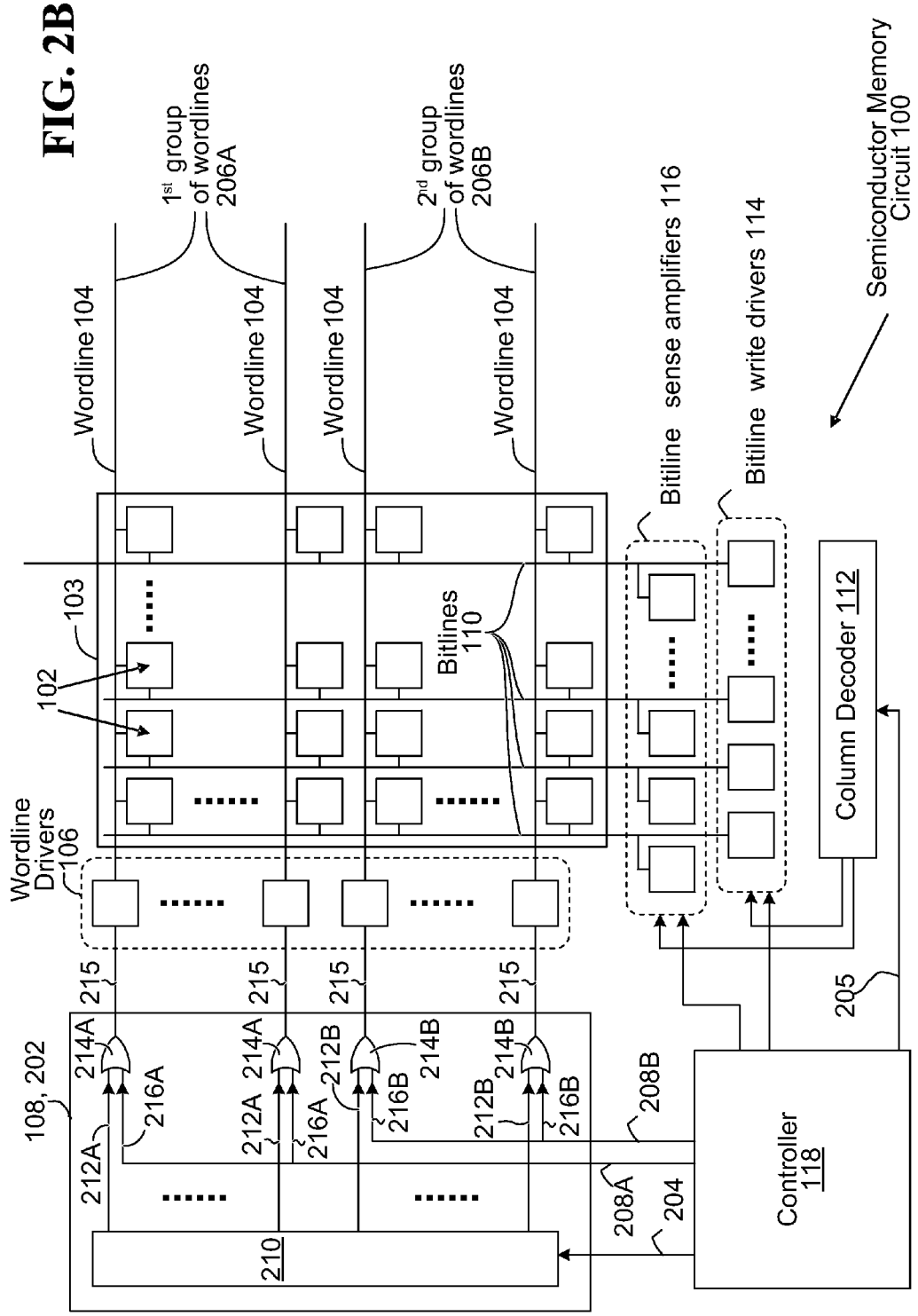

Reference is now made to FIG. 2B, which shows an example of the at least one row decoder 108, in accordance with a second specific non-limiting embodiment of the present invention. This embodiment is identical to FIG. 2A, except that there are two preset control signals 208A, 208B provided by the controller 118. Assertion of each of the preset control signals 208A, 208B causes selection of a respective group of wordlines, referred to herein as a first group of wordlines 206A and a second group of wordlines 206B. Although two row preset control signals 208A, 208B are illustrated, it should be appreciated that the number of preset control signals (and correspondingly the number of groups of wordlines) may be greater than two. Also, although the groups of wordlines 206A, 206B need not be associated with contiguous rows of the memory array 103, assuming that they are will facilitate the reader's understanding.

A possible way to implement this functionality, as shown in FIG. 2B, is to feed each of the outputs of the row decoding circuit 210 belonging to the first group of wordlines 206A to a respective first input 212A of a respective logic "OR" gate 214A, with a respective second input 216A being fed by the preset control signal 208A. This will cause multiple wordlines to be selected (i.e., those in the first group of wordlines 206A) when the preset control signal 208A is asserted. Similarly, each of the outputs of the row decoding circuit 210 belonging to the second group of wordlines 206B to a respective first input 212B of a respective logic "OR" gate 214B, with a respective second input 216B being fed by the preset control signal 208B. This will cause multiple wordlines to be selected (i.e., those in the second group of wordlines 206B) when the preset control signal 208B is asserted.

Alternatively, the preset control signal 208A and the preset control signal 208B may be considered as additional elements of the row signal 204 which, if present, cause, respectively, selection of the group of wordlines 206A or selection of the group of wordlines 206B. Of course, it is contemplated that asserting both the preset control signal 208A and the preset control signal 208B results in selection of all of the wordlines in the first and second groups of wordlines 206A, 206B. Still other ways of implementing the desired functionality will occur to those of skill in the art.

Reference is now made to FIG. 2C, which shows an example of the at least one row decoder 108, in accordance with a third specific non-limiting embodiment of the present invention. In this embodiment, the at least one row decoder 108 comprises a plurality of row decoders, namely a first row decoder 202A and a second row decoder 202B. Although two row decoders 202A, 202B are illustrated, it should be appreciated that the number of row decoders may be greater than two, and generally "N". It should thus be appreciated that the present embodiment applies to instances where the memory array 103 is divided into N physically separate SRAM sub-arrays sharing the same bitlines but having their own individual sets of wordlines.

The first row decoder 202A is capable of selecting an individual one of the wordlines 104 in a first subset of wordlines 280A, based on a row signal 204A issued by the controller 118 (or by an intervening pre-decoder, not shown, which separates an address signal into its components, namely the row signal 204A and a column signal 205). Similarly, the second row decoder 202B is capable of selecting an individual one of the wordlines 104 in a second subset of wordlines 280B, based on a row signal 204B issued by the controller 118 (or by an intervening pre-decoder, not shown, which separates an address signal into its components, namely the row signal 204B and a column signal). The first and second subsets of wordlines may be contiguous or they may interleave.

Additionally, the first row decoder 202A is capable of selecting a first group of wordlines within the first subset of wordlines 280A by activating those of the wordline drivers 106 that are connected to the wordlines in the first group of wordlines. The activated wordline drivers then drive the rows of cells connected to the first group of wordlines. Also, the second row decoder 202B is also capable of selecting a second group of wordlines in the second subset of wordlines 280B by activating those of the wordline drivers 106 that are connected to the wordlines in the second group of wordlines. The activated wordline drivers then drive the rows of cells connected to the second group of wordlines.

Selection of the first group of wordlines by the first row decoder 202A is controlled by a preset control signal 208A, which can be issued by the controller 118. Similarly, selection of the second group of wordlines by the second row decoder 202B is controlled by a preset control signal 208B, which can be issued by the controller 118.

In operation, the controller 118 controls assertion of the preset control signals 208A, 208B, which has the effect of controlling the order in which the first and second groups of wordlines are selected. In response to assertion of a given one of the preset control signals (i.e., 208A, 208B), the corresponding row decoder (i.e., 202A, 202B) selects its own specific group of wordlines within its own subset of wordlines (i.e., 280A, 280B). Once a particular group of wordlines is selected, the cells in the rows connected to the group of wordlines can be written to by driving the corresponding bitlines. Specifically, as already described, the bitline write drivers are controlled so as to set the bitlines to the appropriate levels needed to set the memory cells to the desired logic state, which can be logic "0" or logic "1", for example.

Figure 2D:
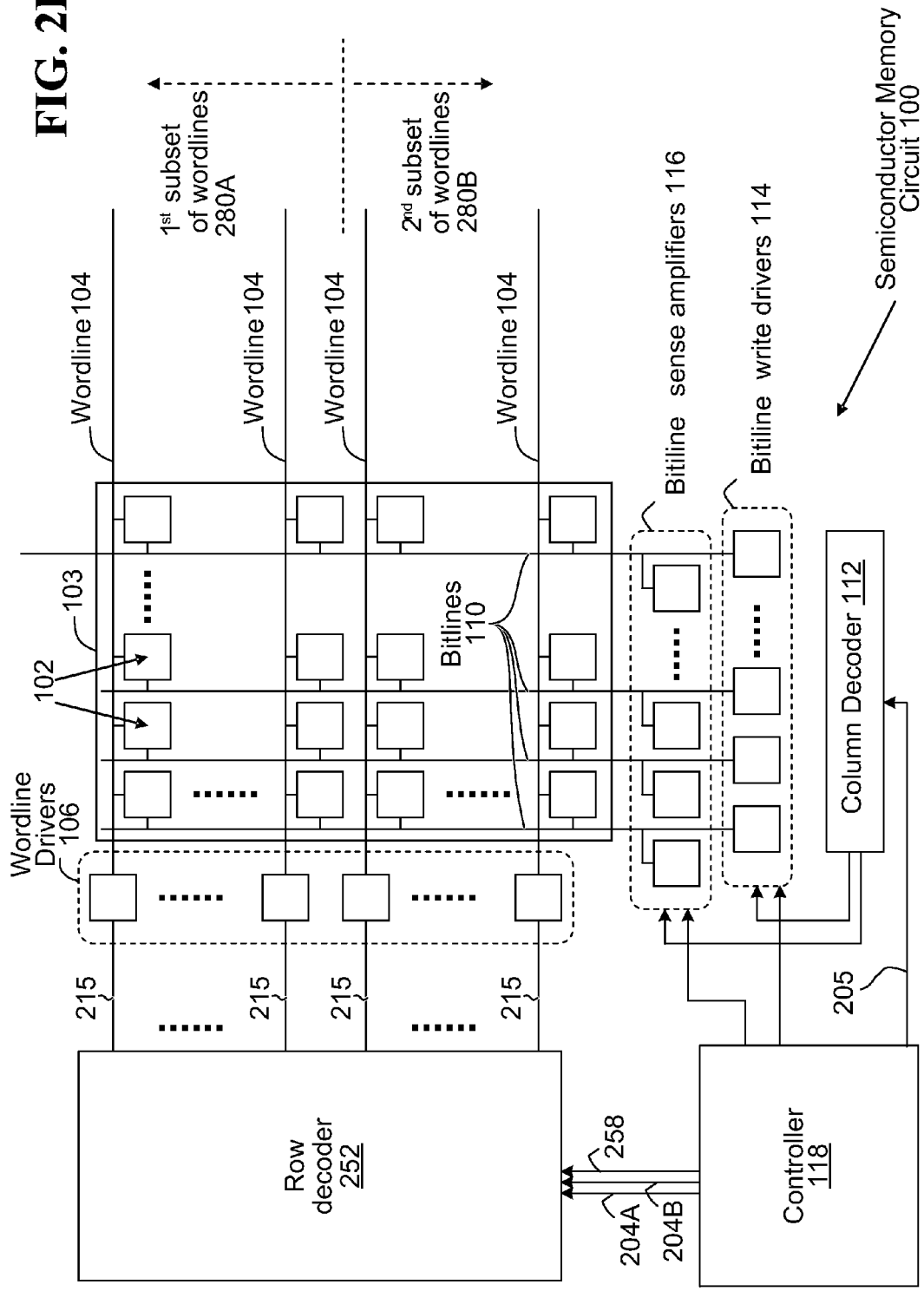

Reference is now made to FIG. 2D, which is an embodiment identical to that of FIG. 2C, except that the plural row decoders are combined into a single, larger row decoder 252, and a single, master preset control signal 258 is provided. However, the two row signals 204A, 204B continue to be provided in order to allow selection of an individual wordline in each of the first and second subsets of wordlines 280A, 280B. Thus, while the embodiment of FIG. 2C required added intelligence in the controller 118 to assert the preset control signals 208A, 208B for control of the first and second row decoders 202A, 202B, the embodiment of FIG. 2D places this intelligence with the row decoder 252 itself by providing control logic for processing the master preset control signal 258. As a result, when the master preset control signal 258 is asserted, the row decoder 252 determines which group of wordlines to select (i.e., the first group of wordlines within the first subset of wordlines 280A or the second group of wordlines within the second subset of wordlines 280B), and in which order.

Those skilled in the art will appreciate that in the above embodiments, assertion of the preset control signal (e.g., 208, 208A, 208B) may occur when the controller 118 determines that it is time to preset the memory array 103. This "preset operation" may be desired or required during power-up operation of the semiconductor memory circuit 100, when the content of individual ones of the memory cells 102 is unknown and is to be set to a predetermined logic state. Alternatively or in addition, the preset operation may be initiated by a soft reset generated by, for example, a watchdog circuit (not shown). Other instances where the preset operation may be desired or required will be apparent to those of skill in the art.

It should be appreciated that the present invention does not impose any particular limitation on the number of groups of wordlines, on the number of wordlines per group or on which wordlines may be part of a same group. Rather, it is expected that those skilled in art will be able to determine a suitable group size, number and membership based on various engineering criteria such as the trade off between peak current (which is inversely proportional to the number of groups) and background writing time (which is proportional to the number of groups).

Moreover, in embodiments that support multiple groups of wordlines, these groups may be selected simultaneously, or one after the other, or in an overlapping fashion, etc.

Furthermore, in embodiments that support multiple preset control signals, the present invention does not impose any particular limitation on the manner or order in which they are asserted by the controller.

Also, the present invention allows both single- and dual-port memory cells to be used. In a specific example employing single-port cells, the bitline write driver for a given column is associated with two of the bitlines 110. In order to set the memory cells connected to the given column to a desired state, one of the two associated bitlines is set to a LOW state and the other one is used to set the memory cells in the given column to the desired state.

With reference to FIG. 3, in accordance with specific non-limiting embodiments of the present invention, the semiconductor memory circuit 100 can be embedded in a system 300. The system 300 may be, for example, an ASIC (application-specific integrated circuit) or a SoC (system on chip), to name a few non-limiting possibilities.

In the context of the examples described above, various elements and circuits are shown connected to each other for the sake of simplicity. In practical applications of the present invention, elements, circuits, etc. may be connected directly to each other. As well, elements, circuits etc. may be connected indirectly to each other through other elements, circuits, etc., necessary for operation of the devices, systems or apparatus of which they form a part. Thus, in actual configuration, the various elements and circuits are directly or indirectly coupled with or connected to each other.

Certain adaptations and modifications of the described embodiments can be made. Therefore, the above discussed embodiments are to be considered illustrative and not restrictive.

What is claimed is:

1. A semiconductor memory circuit, comprising:
a memory array including:
a plurality of wordlines each connected to a respective row of cells; and
a plurality of bitlines each connected to a respective column of cells;
at least one row decoder for selecting a group of wordlines within the plurality of wordlines in response to assertion of a preset control signal;
a plurality of driver circuits for driving the plurality of bitlines respectively and presetting the cells connected to the group of wordlines to a predetermined logic state.

2. The semiconductor memory circuit defined in claim 1, wherein when the preset control signal is not asserted, the at least one row decoder is configured to select an individual one of the wordlines identified by a row signal.

3. The semiconductor memory circuit defined in claim 2, further comprising a controller configured for providing the row signal as part of an address signal.

4. The semiconductor memory circuit defined in claim 1, further comprising a controller configured for asserting the preset control signal.

5. The semiconductor memory circuit defined in claim 4, wherein the controller is further configured for activating the driver circuits after asserting the preset control signal.

6. The semiconductor memory circuit defined in claim 5, wherein the driver circuits are activated simultaneously.

7. The semiconductor memory circuit defined in claim 5, wherein the driver circuits are activated sequentially.

8. The semiconductor memory circuit defined in claim 1, wherein the preset control signal is a first preset control signal, wherein the group of wordlines is a first group of wordlines and wherein the at least one row decoder is further configured for selecting a second group of wordlines within the plurality of wordlines in response to assertion of a second preset control signal.

9. The semiconductor memory circuit defined in claim 8, wherein the first and second groups of wordlines are mutually exclusive.

10. The semiconductor memory circuit defined in claim 8, wherein the at least one row decoder comprises a single row decoder, wherein when the first preset control signal and the second preset control signal are both not asserted, the single row decoder is configured to select an individual one of the wordlines identified by a row signal.

11. The semiconductor memory circuit defined in claim 8, wherein the at least one row decoder comprises a first row decoder and a second row decoder, wherein when the first preset control signal and the second preset control signal are both not asserted, the first row decoder is configured to select an individual one of the wordlines in the first group of wordlines identified by a first row signal and the second row decoder is configured to select an individual one of the wordlines in the second group of wordlines identified by a second row signal.

12. The semiconductor memory circuit defined in claim 8, further comprising a controller configured for asserting the first preset control signal and the second control signal.

13. The semiconductor memory circuit defined in claim 12, wherein the controller is further configured for asserting the first preset control signal and the second control signal simultaneously.

14. The semiconductor memory circuit defined in claim 12, wherein the controller is further configured for asserting the first preset control signal and the second control signal sequentially.

15. The semiconductor memory circuit defined in claim 8, wherein the at least one row decoder comprises circuitry for controlling selection of the first group of wordlines in response to assertion of the first preset control signal and selection of the second group of wordlines in response to assertion of the second preset control signal.

16. The semiconductor memory circuit defined in claim 15, wherein when the first preset control signal and the second present control signal are both not asserted, the at least one row decoder is configured to select an individual one of the wordlines identified by a row signal.

17. The semiconductor memory circuit defined in claim 1, further comprising a plurality of writeline driver circuits, each for driving a respective one of the wordlines when selected.

18. The semiconductor memory circuit defined in claim 1, wherein the wordlines in the group of wordlines are contiguous.

19. The semiconductor memory circuit defined in claim 1, wherein the group of wordlines includes all of the rows of the memory array.

20. The semiconductor memory circuit defined in claim 1, wherein the group of wordlines includes fewer than all of the rows of the memory array.

21. A method for presetting at least part of a memory array, the memory array comprising a plurality of wordlines each connected to a respective row of cells, the method comprising:
    selecting a group of wordlines within the plurality of wordlines in response to assertion of a preset control signal;
    simultaneously presetting memory cells connected to the group of wordlines to a predetermined logic state.

22. The method defined in claim 21, wherein said simultaneously presetting memory cells connected to the group of wordlines to a predetermined logic state comprises simultaneously setting all the memory cells connected to the group of wordlines to the predetermined logic state.

23. The method defined in claim 21, wherein said simultaneously presetting memory cells connected to the group of wordlines to a predetermined logic state comprises simultaneously presetting at least one first memory cell connected to each wordline within said group of wordlines to the predetermined logic state followed by simultaneously presetting at least one second memory cell connected to each wordline within said group of wordlines to the predetermined logic state.

24. The method defined in claim 21, wherein the group of wordlines comprises a first group of wordlines, the method further comprising:
    selecting a second group of wordlines within the plurality of wordlines in response to assertion of a second preset control signal;
    simultaneously presetting memory cells connected to the second group of wordlines to a predetermined logic state.

25. A circuit for use with a memory array that comprises a plurality of wordlines each connected to a respective row of cells within a plurality of rows of cells, the circuit comprising:
    a first input for receiving a row signal indicative of selection of a single one of the rows, hereinafter an individually selected row;
    a second input for receiving a preset control signal indicative of selection of a group of rows, hereinafter jointly selected rows;
    circuitry for combining the row signal and the preset control signal to produce, for each of the rows, a respective wordline selection signal, the wordline selection signal for each of the rows being indicative of selection of that row when it is at least one of (i) the individually selected row and (ii) one of the jointly selected rows, and being indicative of non-selection of that row when it is both not the individually selected row and not one of the jointly selected rows;
    an output for releasing the wordline selection signal for each of the rows to the memory array via a wordline driver.

* * * * *